United States Patent [19]
Robinson

[11] Patent Number: 5,777,574
[45] Date of Patent: Jul. 7, 1998

[54] HIGH RESOLUTION IMAGING RADAR LINEAR FREQUENCY MODULATION BANDWIDTH MULTIPLIER

[75] Inventor: John P. Robinson, Newton, Conn.

[73] Assignee: Northrop Grumman Corporation, Los Angeles, Calif.

[21] Appl. No.: 769,091

[22] Filed: Dec. 18, 1996

[51] Int. Cl.$^6$ .............................. G01S 13/90; G01S 7/282
[52] U.S. Cl. ........................... 342/25; 342/201; 342/202; 342/203; 342/204
[58] Field of Search ........................ 342/25, 201, 202, 342/203, 204

[56] References Cited

U.S. PATENT DOCUMENTS 4,388,622   6/1983  Fletcher, Jr. ............................ 342/112

*Primary Examiner*—John B. Sotomayor
*Attorney, Agent, or Firm*—Walter G. Sutcliff

[57] ABSTRACT

An apparatus and method of linear frequency modulation waveform bandwidth multiplication including a digital linear frequency modulation waveform synthesizer for generating a synthesized waveform having an upchirp component of linearly varying frequency during a first half signal duration of the synthesized waveform followed by a downchirp component having linearly varying frequency during a second half of the signal duration of the synthesized waveform. The synthesized waveform is upconverted and subsequently bandpass filtered to provide a filtered waveform to a mixer for mixing with local oscillation signals. The upchirp and downchirp components of the filtered waveform are respectively mixed by first and second local oscillation signals having respective first and second oscillation frequencies in the mixer. The local oscillation signal frequencies have a predetermined relationship to ensure that the signal components of the output signal corresponding to the upchirp and downchirp components transition smoothly. The corresponding linear frequency modulation bandwidth multiplied signal has decreased nonlinearities.

25 Claims, 3 Drawing Sheets

HIGH RESOLUTION IMAGING RADAR LINEAR FREQUENCY MODULATION BANDWIDTH MULTIPLIER

CROSS REFERENCE OF RELATED APPLICATIONS

This application is related to co-pending application U.S. Ser. No. 08/668897 (Northrop Grumman Docket N-1281) entitled "Multi-Mode Radar System Having Real-Time Ultra-High Resolution Synthetic Aperture Radar (SAR) Capability" filed on Jun. 24, 1996 by Miguel E. Loiz et al now U.S. Pat. No. 5,708,436.

BACKGROUND OF THE INVENTION

1. Field of the Invention

The present invention relates to a method and apparatus for linear frequency modulation (LFM) waveform bandwidth multiplication.

2. Description of the Background Art

In high resolution synthetic aperture radar systems, the bandwidth of the radar signal determines resolution of the system and the waveform linearity of the radar signal determines system dynamic range and false target levels. A typical frequency doubler used in conventional synthetic aperture radar systems comprises a multiplier for multiplying a synthesized waveform by two. The typical frequency doubler employing a multiplier theoretically degrades the linearity of the radar signal by as much as 6 dB since the frequency doubler essentially adds two versions of the waveform together, doubling noise and non-linearities. Performance of conventional synthetic aperture radar systems using a conventional frequency doubler is therefore limited.

SUMMARY OF THE INVENTION

Accordingly, an object of the present invention is to provide an improved method and apparatus for linear frequency modulation waveform bandwidth multiplication which produces a bandwidth multiplied signal having decreased nonlinearities.

These and other objects of the present invention are fulfilled by providing a linear frequency modulation waveform multiplier having a waveform synthesizer for generating a synthesized waveform signal having an upchirp component for a first half of a signal duration of the synthesized waveform signal followed by a downchirp component for a second half of the signal duration; and a converter for mixing the upchirp component of a synthesized waveform signal with a first local oscillation signal having a frequency $f_{lo1}$ and the downchirp component of the synthesized waveform signal with a second local oscillation signal having a frequency $f_{lo2}$ to provide a linear frequency modulated signal having a bandwidth twice that of a bandwidth of the synthesized waveform signal, the frequencies $f_{lo1}$ and $f_{lo2}$ having a pre-determined frequency relationship.

In a preferred embodiment, the converter includes a first mixer for upconverting the synthesized waveform with an upconversion frequency $f_{upc}$ to output an upconverted waveform signal, a bandpass filter for passing only a selected band of the upconverted waveform signal as a filtered waveform signal, a local oscillator for selectively outputting the first and second local oscillation signals and a second mixer for mixing the filtered waveform signal with the first and second local oscillation signals to provide the linear frequency modulated signal.

In this preferred embodiment, the signal duration is T and the upchirp component varies linearly from a frequency $f_1$ to a frequency $f_2$ and the downchirp component varies linearly from the frequency $f_2$ to the frequency $f_1$, wherein the predetermined frequency relationship is that $f_{lo2} = 2(f_{upc} + f_2) - f_{lo1}$. In a still further preferred embodiment, $f_{upc}$ is set equal to $f_{lo1}$ such that $f_{lo2} = f_{lo1} + 2f_2$.

In accordance with this embodiment, the signal frequency for the duration of the linear frequency modulated signal corresponding to the upchirp component of the synthesized waveform signal and the signal frequency for the duration of the linear frequency modulated signal corresponding to the downchirp component of the synthesized waveform signal are properly aligned and pieced together to transition smoothly.

These and other objects of the present invention are also fulfilled by providing a method of generating a linear frequency modulated signal including generating a synthesized waveform signal having an upchirp component for a first half of a signal duration of the synthesized waveform signal followed by a downchirp component for a second half of the signal duration; and mixing the upchirp component of the synthesized waveform signal with a first local oscillation signal having a frequency $f_{lo1}$ and the downchirp component of the synthesized waveform signal with a second local oscillation signal having a frequency $f_{lo2}$ to provide a linear frequency modulated signal having a bandwidth twice that of a bandwidth of the synthesized waveform signal, wherein the frequencies $f_{lo1}$ and $f_{lo2}$ have a predetermined relationship.

In a further preferred embodiment, the step of mixing the upchirp component includes upconverting the synthesized waveform signal with a frequency $f_{upc}$ to provide an upconverted waveform signal, passing only a selected band of the upconverted waveform signal to provide a filtered waveform signal, generating the first and second local oscillation signals and downconverting the filtered waveform signal with the first and second local oscillation signals to provide the linear frequency modulated signal.

In this further preferred embodiment, the signal duration is T and the upchirp component varies linearly from a frequency $f_1$ to a frequency $f_2$ and the downchirp component varies linearly from the frequency $f_2$ to the frequency $f_1$, wherein the predetermined frequency relationship is that $f_{lo2} = 2(f_{upc} + f_2) - f_{lo1}$. In a still further preferred embodiment, $f_{upc}$ is set equal to $f_{lo1}$ such that $f_{lo2} = f_{lo1} + 2f_2$.

In accordance with this embodiment, the signal frequency for the duration of the linear frequency modulated signal corresponding to the upchirp component of the synthesized waveform signal and the signal frequency for the duration of the linear frequency modulated signal corresponding to the downchirp component of the synthesized waveform signal are properly aligned and pieced together to transition smoothly.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitative of the present invention and wherein.

DETAILED DESCRIPTION OF THE PREFERRED EMBODIMENTS

Figure 1:
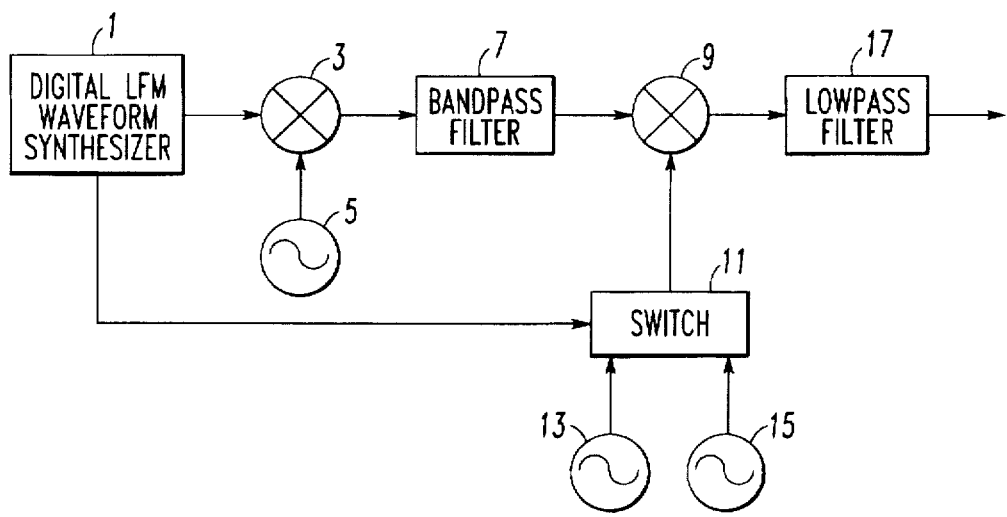
FIG. 1 illustrates a block diagram of a linear frequency modulation waveform bandwidth multiplier of an embodiment of the present application.
Figure 2:
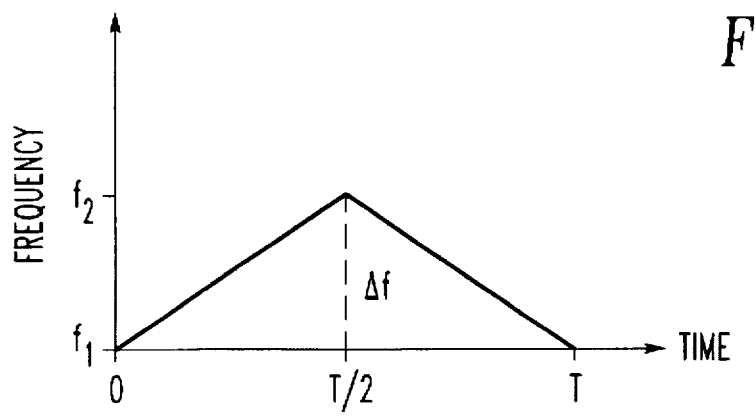
FIG. 2 illustrates an example of a synthesized waveform output by the digital linear frequency modulation waveform synthesizer of FIG. 1.

An embodiment of a linear frequency modulation waveform bandwidth multiplier is illustrated in FIG. 1. A digital linear frequency modulation (LFM) waveform synthesizer 1 outputs a synthesized waveform as illustrated in FIG. 2 which includes an upchirp component which varies linearly from frequency $f_1$ to frequency $f_2$ from time t=0 to time t=T/2 during the first half of the signal duration of time period T. The synthesized waveform also includes a downchirp component which varies linearly from frequency $f_2$ to frequency $f_1$ from time t=T/2 to time t=T during the second half of the signal duration. The $\Delta f$ component is illustrated as $(f_2-f_1)$. It is to be understood here that frequencies $f_1$ and $f_2$ are not necessarily limited and that any various frequencies may be selected such that frequency $f_2$ is greater than frequency $f_1$. Also, signal duration time period T is not necessarily limited and may be selected as any suitable time period.

The synthesized waveform generated by digital LFM waveform synthesizer 1 is output to an upconverter comprising mixer 3 and local oscillator 5. The upconverter translates the synthesized waveform to an upconverted synthesized waveform having a higher working frequency more suitable for subsequent conversion. The upconverted waveform is output to bandpass filter 7 which has a bandpass for selectively filtering out the lower sideband of the upconverted signal waveform and the local oscillation signal provided from local oscillator 5 in order to pass as an output a selected band of the upconverted synthesized waveform. The filtered waveform is subsequently input to mixer 9.

Figure 3:
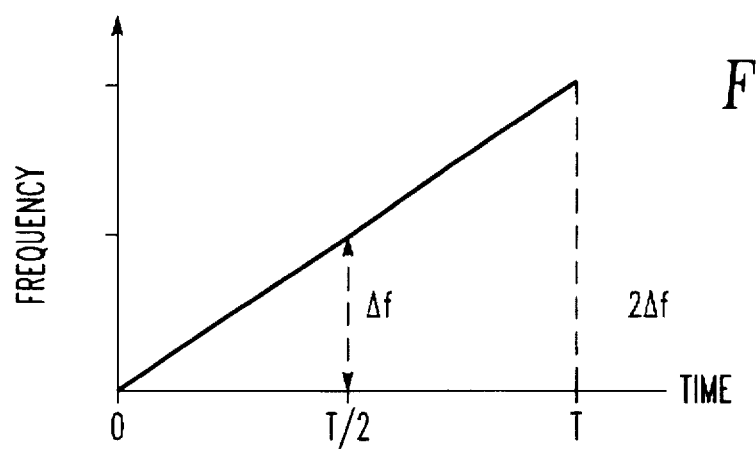
FIG. 3 illustrates a linear frequency modulated waveform output from the linear frequency modulation waveform bandwidth multiplier of FIG. 1.

Mixer 9 functions as a frequency downconverter to properly rotate and align frequencies of the upchirp and downchirp components of the filtered waveform to provide a linear frequency modulated waveform $f_{out}$ which is illustrated in FIG. 3 and which is subsequently filtered in lowpass filter 17. The linear frequency modulated waveform $f_{out}$ is pieced together as having a frequency excursion $2\Delta f$ over a corresponding signal duration of time period T, wherein the $2\Delta f$ component as illustrated equals $2(f_2-f_1)$. The linear frequency modulated waveform $f_{out}$ has a bandwidth double that of the synthesized waveform output from digital LFM waveform synthesizer 1 and does not include added phase and frequency distortion.

Mixer 9 mixes the filtered waveform output from bandpass filter 7 with a local oscillation signal provided from switch 11 to output a linear frequency modulated waveform $f_{out}$ which is subsequently filtered in lowpass filter 17 to remove the lower sideband and the local oscillation signal provided from switch 11. Local oscillator 13 provides a local oscillation signal having frequency $f_{lo1}$ to switch 11 and local oscillator 15 provides a local oscillation signal having frequency $f_{lo2}$ to switch 11. A switch enable signal is input to switch 11 from digital LFM waveform synthesizer 1. Under control of the switch enable signal from digital LFM waveform synthesizer 1, switch 11 outputs the local oscillation signal having frequency $f_{lo1}$ from local oscillator 13 to mixer 9 during a period of time when the upchirp component of the filtered waveform is input to mixer 9 from bandpass filter 7, so that the upchirp component of the filtered waveform is mixed with the local oscillation signal having frequency $f_{lo1}$. The switch enable signal further controls switch 11 to output the local oscillation signal having frequency $f_{lo2}$ from local oscillator 15 to mixer 9 during a period of time when the downchirp component of the filtered waveform is input to mixer 9 from bandpass filter 7, so that the downchirp component of the filtered waveform is mixed with the local oscillation signal having frequency $f_{lo2}$. It is to be understood that switch 11 may be any type of switch known in the art capable of switching between first and second inputs to selectively provide an output in accordance with a switch enable signal.

Figure 4:
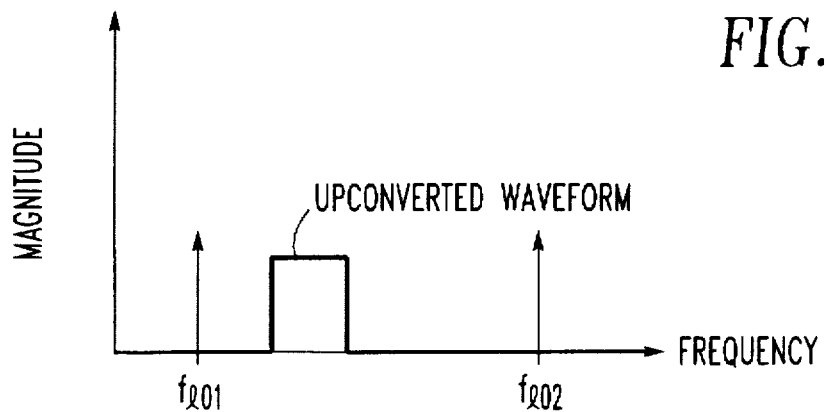
FIG. 4 illustrates the frequency spectrum of the local oscillation signals with respect to the upconverted synthesized waveform of the linear frequency modulation waveform bandwidth multiplier of FIG. 1.

In greater detail, the upchirp component from time t=0 to time t=T/2 of the filtered waveform having signal duration T is mixed or subtracted from the local oscillation signal having frequency $f_{lo1}$, in mixer 9. The downchirp component from time t=T/2 to time t=T of the filtered waveform is mixed or subtracted from the local oscillation signal having frequency $f_{lo2}$. The frequency spectrum of the local oscillation signals with respect to the upconverted synthesized waveform output from mixer 3 is illustrated in FIG. 4. The frequency $f_{lo2}$ of the local oscillation signal output from local oscillator 15 is greater than the frequency range of the upconverted synthesized waveform and the frequency $f_{lo1}$ of the local oscillation signal output from local oscillator 13 is less than the frequency range of the upconverted synthesized waveform. The frequency of the upconverted synthesized waveform has frequencies between frequency $f_{lo1}$ and frequency $f_{lo2}$.

The signal frequency for the duration of the linear frequency modulated waveform $f_{out}$ corresponding to the upchirp component of the synthesized waveform from time t=0 to time t=T/2 can be expressed as follows:

$$f_{out}=(f_{upc}+f_{upchirp})-f_{lo1} \qquad (1).$$

The signal frequency for the duration of the linear frequency modulated waveform $f_{out}$ corresponding to the downchirp component of the synthesized waveform from time t=T/2 to time t=T can be expressed as follows:

$$f_{out} = f_{lo2} - (f_{upc} + f_{downchirp}) \quad (2)$$

It is to be understood that $f_{upc}$ represents the frequency of the local oscillation signal output from local oscillator 5 to mixer 3 of the upconversion stage. It is to be further understood that $f_{upchirp}$ and $f_{downchirp}$ correspond to the frequencies of the respective upchirp component and downchirp component output from digital LFM waveform synthesizer 1 at time t.

In order to ensure that the signal frequency for the duration of the linear frequency modulated waveform $f_{out}$ corresponding to the upchirp component of the filtered waveform and the signal frequency for the duration of the linear frequency modulated waveform $f_{out}$ corresponding to the downchirp component of the filtered waveform are properly aligned and pieced together to transition smoothly as illustrated in FIG. 3, a relationship between frequencies $f_{lo1}$ and $f_{lo2}$ must exist as follows:

$$(f_{upc} + f_{maxchirp}) - f_{lo1} = f_{lo2} - (f_{upc} + f_{maxchirp}) \quad (3)$$

It is to be understood that $f_{maxchirp}$ is equal to $f_2$.

In view of equation (3), the frequency $f_{lo2}$ of the local oscillation signal output from local oscillator 15 can be expressed as:

$$f_{lo2} = 2f_{upc} - f_{lo1} + 2f_{maxchirp} \quad (4)$$

Moreover, by setting the frequency $f_{upc}$ of the local oscillation signal output from local oscillator 5 equal to the frequency $f_{lo1}$ of the local oscillation signal output from local oscillator 13 in order to reduce the number of generated frequencies required, the following relationship can be derived:

$$f_{lo2} = f_{lo1} + 2f_{maxchirp} \quad (5)$$

Accordingly, the relationship of equation (4) must be maintained in order to ensure that the signal frequencies for the durations of the linear frequency modulated waveform output from mixer 9 corresponding to the upchirp component and the downchirp component of the filtered waveform output from bandpass filter 7 are properly pieced together and aligned to transition smoothly as illustrated in FIG. 3.

As an example, the synthesized waveform output from digital LFM waveform synthesizer 1 as illustrated in FIG. 2 may be varied linearly between a frequency $f_1=100$ MHz and a frequency $f_2=200$ MHz. The linear frequency modulated waveform $f_{out}$ output from mixer 9 as illustrated in FIG. 3 would thus vary linearly from a frequency $f_{out}=100$ MHz to a frequency $f_{out}=300$ MHz which corresponds to a frequency of $(f_1+2\Delta f)$ for the $f_{lo1}=f_{upc}$ case. As can be readily understood from this example, the linear frequency modulation waveform multiplier of FIG. 1 doubles the bandwidth of the synthesized waveform output from digital LFM waveform synthesizer 1. The linear frequency modulated waveform $f_{out}$ of this example having a bandwidth 200 MHz is twice the 100 MHz bandwidth of the synthesized waveform. It is to be understood that the above-noted example is not to be construed as limiting and that various frequencies may be selected. Moreover, the output center frequency of the linear frequency modulated waveform $f_{out}$ can be altered by selection of appropriate frequencies $f_{upc}$, $f_{lo1}$ and $f_{lo2}$.

Figure 5:
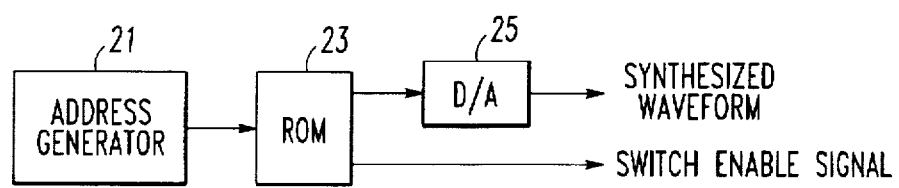
FIG. 5 illustrates a first embodiment of the digital linear frequency modulation waveform synthesizer of the linear frequency modulation waveform bandwidth multiplier of FIG. 1.

In a preferred embodiment, digital LFM waveform synthesizer 1 digitally synthesizes the synthesized waveform directly. Digital LFM waveform synthesizer 1 may comprise a memory driven digital/analog converter as illustrated in FIG. 5, which includes ROM 23 in which a digital representation of the synthesized waveform including the upchirp component and the downchirp component is stored. The digitized representation of the synthesized waveform is output from ROM 23 to D/A converter 25 under control of address generator 21. The synthesized waveform is subsequently output from D/A converter 25. ROM 23 is configured to also provide a switch enable signal to switch 11 as illustrated in FIG. 1 so that the local oscillation signal of frequency $f_{lo1}$ from local oscillator 13 is provided from switch 11 as input to mixer 9 when the signal duration of the upchirp component of the filtered waveform is input to mixer 9 from bandpass filter 7. The switch enable signal further controls switch 11 so that the local oscillation signal of frequency $f_{lo2}$ from local oscillator 15 is provided from switch 11 as input to mixer 9 when the signal duration of the downchirp component of the filtered waveform is input to mixer 9 from bandpass filter 7.

It is to be understood that ROM 23 may include any known timing circuitry which would appropriately provide the switch enable signal in synchronism with input of the corresponding upchirp and downchirp components of the filtered waveform to mixer 9. For example, one specific output bit of ROM 23 may be set equal to "0" for the upchirp duration and a logic "1" for the downchirp duration. It is to be further understood that address generator 21 may be any known address generator capable of addressing ROM 23. In an alternative embodiment, the digital representation of the synthesized waveform may be stored in a RAM.

Figure 6:
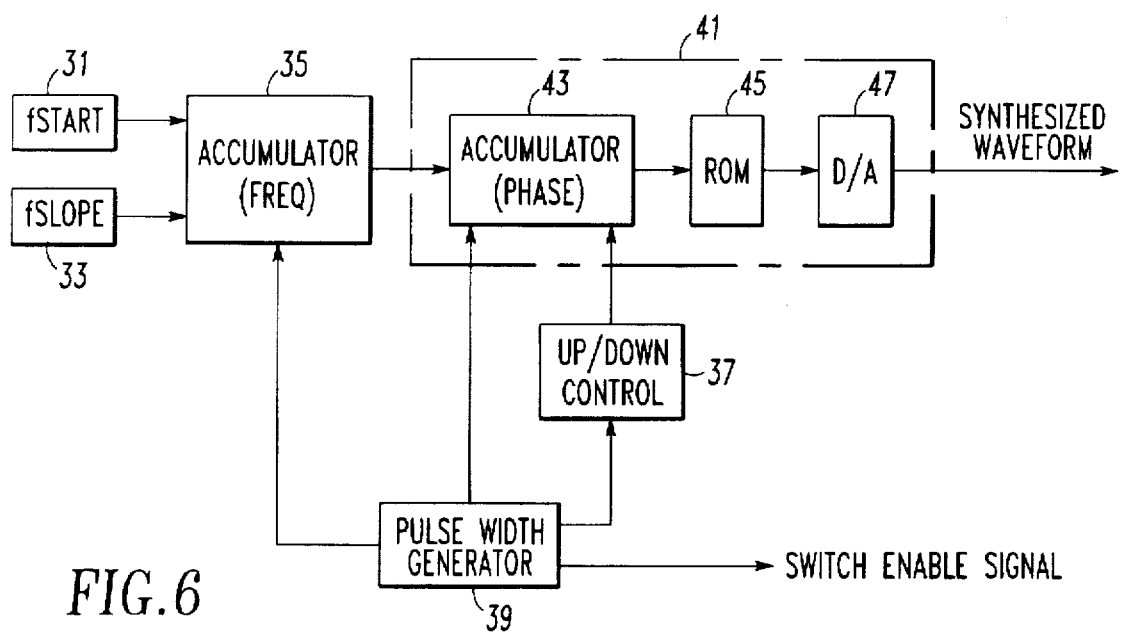
FIG. 6 illustrates an alternative embodiment of the digital linear frequency modulation waveform synthesizer of the linear frequency modulation waveform bandwidth multiplier of FIG. 1.

FIG. 6 illustrates an alternative embodiment of digital LFM waveform synthesizer 1 including a dual accumulator. Frequency start and frequency slope words are stored in ROMs 31 and 33 and are respectively input to frequency accumulator 35 which generates digitized frequency words that are input to numerically controlled oscillator (NCO) 41 under control of an output signal provided from pulse width generator 39 to select an output frequency. NCO 41 is comprised of a phase accumulator 43, a ROM 45 and a digital/analog converter 47. Pulse width generator 39 provides an NCO reset signal to accumulator 43. Up/down control 37 provides a timing signal to accumulator 43 under control of an output signal from pulse width generator 39. Pulse width generator 39 also provides the switch enable signal for controlling switch 11 in the manner previously described. Digital to analog converter 47 of NCO 41 outputs the synthesized waveform. The dual accumulator digital LFM waveform synthesizer as illustrated in FIG. 6 is described in detail in co-pending application U.S. Ser. No. 08/668.897 (Northrop Grumman Docket No. N-1281), the entire contents of which are incorporated herein by reference.

The linear frequency modulation waveform multiplier of FIG. 1 provides a scheme for multiplying linear frequency modulated waveforms without degrading waveform linearity. It is to be understood that the disclosed synthesized waveform and the frequencies described with respect to the linear frequency modulation waveform multiplier of FIG. 1 are not to be construed as limiting. For example, the linear frequency modulation waveform multiplier of FIG. 1 can be configured to support other multiplication values. This may be achieved by generating the synthesized waveform output from digital LFM waveform synthesizer 1 to include additional sequential upchirp/downchirp pairs and by increasing the number of local oscillation signals provided to mixer 9 of FIG. 1.

Figure 7:
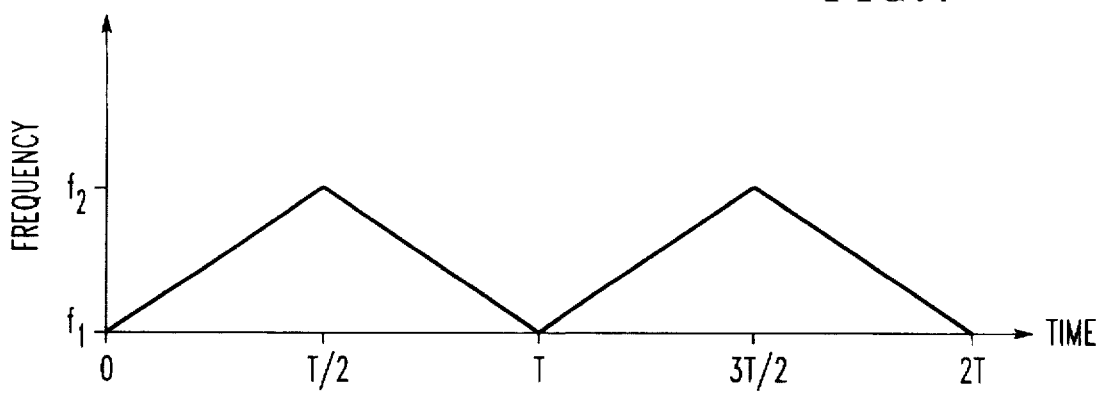
FIG. 7 illustrates a synthesized waveform of a further embodiment of the linear frequency modulation waveform bandwidth multiplier of FIG. 1.
Figure 8:
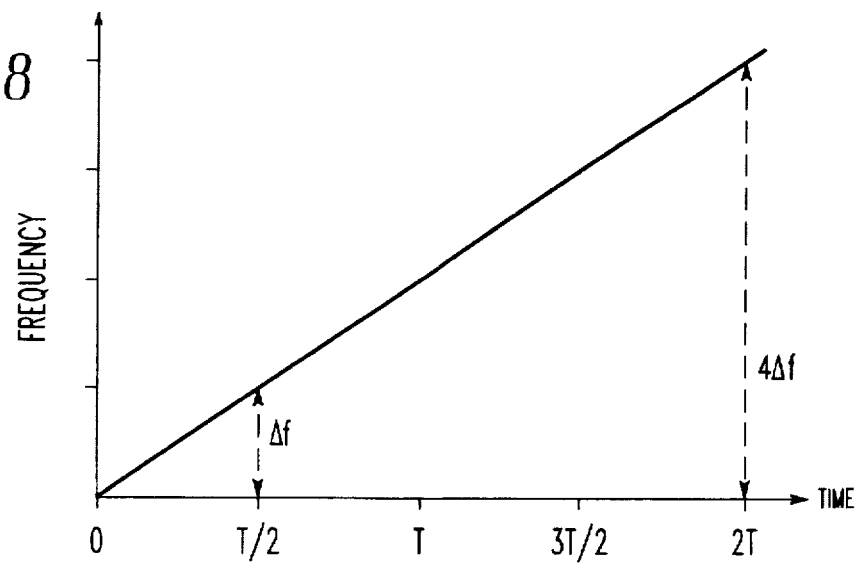
FIG. 8 illustrates a linear frequency modulated waveform generated by the linear frequency modulation waveform bandwidth multiplier of the further embodiment.
Figure 9:
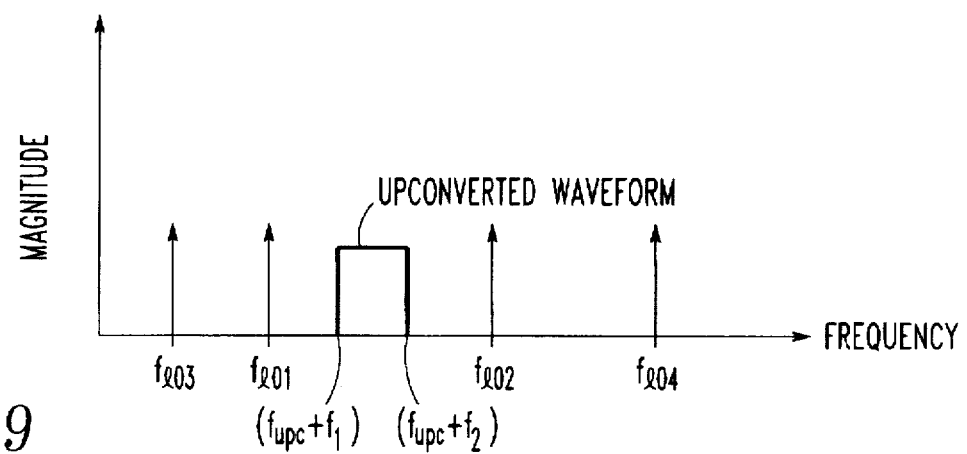
FIG. 9 illustrates the frequency spectrum of the local oscillation signals with respect to the upconverted synthesized waveform of the linear frequency modulation waveform bandwidth multiplier of the further embodiment.

For example, digital LFM waveform synthesizer 1 can be modified to output a synthesized waveform having two sequential upchirp/downchirp component pairs as illustrated in FIG. 7. Switch 11 of this embodiment would be coupled to additional local oscillators for respectively providing local oscillation signals having frequencies $f_{lo3}$ and $f_{lo4}$ for multiplication with the respective upchirp and downchirp components of the second upchirp/downchirp pair of FIG. 7. The corresponding linear frequency modulated waveform $f_{out}$ as illustrated in FIG. 8 would have a bandwidth of (2n$\Delta$f), wherein n equals the number of upchirp/downchirp component pairs of the synthesized waveform, and the number of local oscillator pairs providing inputs to mixer 9 of the downconversion stage. In this embodiment, since the number of upchirp/downchirp component pairs is two, and the corresponding number of local oscillator pairs is two, the bandwidth of the linear frequency modulated waveform $f_{out}$ would be 4$\Delta$f such that the linear frequency modulation waveform multiplier is a multiply by four multiplier. The frequency spectrum of the local oscillation signals and the upconverted waveform output from mixer 3 of FIG. 1 is illustrated in FIG. 9. In order to ensure smooth transition between upchirp and downchirp components in the linear frequency modulated waveform $f_{out}$ illustrated in FIG. 8, the following equations (6)–(8) must be satisfied:

$$f_{lo2}=2(f_{upc}+f_2)-f_{lo1} \quad (6),$$

$$f_{lo2}2(f_{upc}+f_1)-f_{lo3} \quad (7)$$

and $$f_{lo4}=2(f_{upc}+f_2)-f_{lo3} \quad (8).$$

In a further embodiment, the synthesized waveform may include an additional upchirp component following the sequential upchirp/downchirp component pairs. For example, an upchirp component may be generated following the two upchirp/downchirp sequential pairs illustrated in FIG. 7. This particular multiplier would require five local oscillators outputting corresponding local oscillation signals and would be a multiply by five multiplier. As should be clear, various multiplication values can be achieved by generating upchirp/downchirp component pairs followed by an upchirp component.

It is to be further understood that the linear frequency modulation waveform multiplier of FIG. 1 is not necessarily limited as a hardware implementation. The multiplier of FIG. 1 may be software implemented as microprocessor based using stored programming as would be well within the level of ordinary skill.

Moreover, oscillators 13 and 15 and switch 11 may be replaced with a programmable numerically controlled oscillator (NCO). The NCO would be controlled in the manner of switch 11 in order to provide local oscillation signals having frequencies which change as described previously.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A linear frequency modulation waveform multiplier comprising:

digital waveform synthesis means for generating a chirp signal having an upchirp component varying linearly from a frequency $f_1$ to a frequency $f_2$ during a first half of a signal duration of the chirp signal and a downchirp component varying linearly from the frequency $f_2$ to the frequency $f_1$ during a second half of the signal duration of the chirp signal;

a first mixer, coupled to said digital waveform synthesizing means, for mixing the chirp signal with an upconversion signal having a frequency $f_{upc}$ to output an upconverted chirp signal;

a bandpass filter, coupled to said first mixer, for passing only a selected band of the upconverted chirp signal as a filtered chirp signal;

a second mixer, coupled to said bandpass filter, for mixing the filtered chirp signal with a local oscillation signal to output a linear frequency modulated signal; and local oscillator means, coupled to said second mixer, for outputting the local oscillation signal as having a frequency $f_{lo1}$ when an upchirp component of a first half of the signal duration of the filtered chirp signal is input to said second mixer and as having a frequency $f_{lo2}$ when a downchirp component of a second half of the signal duration of the filtered chirp signal is input to said second mixer.

2. The linear frequency modulation waveform multiplier of claim 1, wherein said local oscillation means comprises:

a first local oscillator for generating a first oscillation signal having the frequency $f_{lo1}$;

a second local oscillator for generating a second oscillation signal having the frequency $f_{lo2}$; and switch means, responsive to a switch enable signal, for outputting as the local oscillation signal the first oscillation signal when the upchirp component of the first half of the signal duration of the filtered chirp signal is input to said second mixer and the second oscillation signal when the downchirp component of the second half of the signal duration of the filtered chirp signal is input to said second mixer.

3. The linear frequency modulation waveform multiplier of claim 2, wherein said digital waveform synthesis means generates the switch enable signal to be a first value when the upchirp component of the first half of the signal duration of the filtered chirp signal is input to said second mixer and to be a second value when the downchirp component of the second half of the signal duration of the filtered chirp signal is input to said second mixer.

4. The linear frequency modulation waveform multiplier of claim 1, wherein the signal duration is T and $f_{lo2}=2(f_{upc}+f_2)-f_{lo1}$.

5. The linear frequency modulation waveform multiplier of claim 4, wherein $f_{upc}$ is set equal to $f_{lo1}$ such that $f_{lo2}=f_{lo1}+2f_2$.

6. The linear frequency modulation waveform multiplier of claim 1, wherein the frequency $f_{lo2}$ is greater than the frequency $f_{lo1}$.

7. A method of generating a linear frequency modulation signal comprising the steps of:

a) generating a chirp signal having an upchirp component varying linearly from a frequency $f_1$ to a frequency $f_2$ during a first half of a signal duration of the chirp signal and a downchirp component varying linearly from the frequency $f_2$ to the frequency $f_1$ during a second half of the signal duration of the chirp signal;

b) frequency shifting the chirp signal using an upconversion signal having a frequency $f_{upc}$ to provide an upconverted chirp signal;

c) passing only a selected band of the upconverted chirp signal to provide a filtered chirp signal;

d) downconverting the filtered chirp signal using a local oscillation signal to output a linear frequency modulated signal; and e) generating the local oscillation signal as having a frequency $f_{lo1}$ for downconversion with an upchirn component of a first half of the signal duration of the filtered chirp signal in said step d) and as having a frequency $f_{lo2}$ for downconversion with a downchirp component of a second half of the signal duration of the filtered chirp signal in said step d).

8. The method of generating a linear frequency modulation signal of claim 7, wherein the signal duration is T and $f_{lo2}=2(f_{upc}+f_2)-f_{lo1}$.

9. The method of generating a linear frequency modulation signal of claim 8, wherein $f_{upc}$ is set equal to $f_{lo1}$ such that $f_{lo2}=f_{lo1}+2f_2$.

10. The method of generating a linear frequency of claim 7, wherein the frequency $f_{lo2}$ is greater than the frequency $f_{lo1}$.

11. A linear frequency modulation waveform multiplier comprising:

waveform synthesis means for generating a synthesized waveform signal having an upchirp component for a first half of a signal duration of the synthesized waveform signal followed by a downchirp component for a second half of the signal duration; and conversion means, coupled to said waveform synthesis means, for mixing the upchirp component of the synthesized waveform signal with a first local oscillation signal having a frequency $f_{lo1}$ and the downchirp component of the synthesized waveform signal with a second local oscillation signal having a frequency $f_{lo2}$ to provide a linear frequency modulated signal having a bandwidth twice that of a bandwidth of the synthesized waveform signal, the frequencies $f_{lo1}$ and $f_{lo2}$ having a predetermined frequency relationship.

12. The linear frequency modulation waveform multiplier of claim 11, wherein said conversion means comprises:

a first mixer, coupled to said waveform synthesis means, for upconverting the synthesized waveform signal with an upconversion frequency $f_{upc}$ to output an upconverted waveform signal;

a bandpass filter, coupled to said first mixer, for passing only a selected band of the upconverted waveform signal as a filtered waveform signal;

local oscillation means for selectively outputting the first and second local oscillation signals; and a second mixer, coupled to said bandpass filter and said local oscillation means, for mixing the filtered waveform signal with the first and second local oscillation signals to provide the linear frequency modulated signal.

13. The linear frequency waveform multiplier of claim 12, wherein the signal duration is T and the upchirp component varies linearly from a frequency $f_1$ to a frequency $f_2$ and the downchirp component varies linearly from the frequency $f_2$ to the frequency $f_1$, the predetermined frequency relationship being that $f_{lo2}=2(f_{upc}+f_2)-f_{lo1}$.

14. The linear frequency waveform multiplier of claim 13, wherein $f_{upc}$ is set equal to $f_{lo1}$ such that $f_{lo2}=f_{lo1}+2f_2$.

15. The linear frequency modulation waveform multiplier of claim 12, wherein said local oscillation means comprises:

a first local oscillator for generating the first local oscillation signal;

a second local oscillator for generating the second local oscillation signal; and switch means, coupled to said first and second local oscillators, for selectively outputting the first and second local oscillation signals in accordance with a switching signal output from said waveform synthesis means indicative of signal duration.

16. The linear frequency modulation waveform multiplier of claim 11, wherein the frequency $f_{lo2}$ is greater than the frequency $f_{lo1}$.

17. A method of generating a linear frequency modulated signal comprising the steps of:

a) generating a synthesized waveform signal having an upchirp component for a first half of a signal duration of the synthesized waveform signal followed by a downchirp component for a second half of the signal duration; and b) mixing the upchirp component of the synthesized waveform signal with a first local oscillation signal having a frequency $f_{lo1}$ and the downchirp component of the synthesized waveform signal with a second local oscillation signal having a frequency $f_{lo2}$ to provide a linear frequency modulated signal having a bandwidth twice that of a bandwidth of the synthesized waveform signal, the frequencies $f_{lo1}$ and $f_{lo2}$ having a predetermined relationship.

18. The method of generating a linear frequency modulated signal of claim 17, wherein said step b) comprises:

b1) upconverting the synthesized waveform signal with a frequency $f_{upc}$ to provide an upconverted waveform signal;

b2) passing only a selected band of the upconverted waveform signal to provide a filtered waveform signal;

b3) generating the first and second local oscillation signals; and b4) downconverting the filtered waveform signal with the first and second local oscillation signals to provide the linear frequency modulated signal.

19. The method of generating a linear frequency modulated signal of claim 18, wherein the signal duration is T and the upchirp component varies linearly from a frequency $f_1$ to a frequency $f_2$ and the downchirp component varies linearly from the frequency $f_2$ to the frequency $f_1$, the predetermined frequency relationship being that $f_{lo2}=2(f_{upc}+f_2)-f_{lo1}$.

20. The method of generating a linear frequency modulated signal of claim 19, wherein $f_{upc}$ is set equal to $f_{lo1}$ such that $f_{lo2}=f_{lo1}+2f_2$.

21. The method of generating a linear frequency modulated signal of claim 17, wherein the frequency $f_{lo2}$ is greater than the frequency $f_{lo1}$.

22. A linear frequency modulation waveform multiplier comprising:

waveform synthesis means for generating a synthesized waveform signal having n sequential pairs of upchirp/downchirp components, each of the n sequential pairs having an upchirp component for a first half of a signal duration of a pair followed by a downchirp component for a second half of the signal duration of the pair; and conversion means, coupled to said waveform synthesis means, for respectively mixing the upchirp components and the downchirp components of the n sequential pairs of the synthesized waveform with one of 2n local oscillation signals each having a different respective frequency to provide a linear frequency modulated signal having a bandwidth 2n times greater than a bandwidth of the synthesized waveform signal.

23. The linear frequency modulation waveform multiplier of claim 22, wherein said waveform synthesis means generates the synthesized waveform signal as having an additional upchirp component following said n sequential pairs of upchirp/downchirp components, said conversion means mixing the additional upchirp component with an additional local oscillation signal having a frequency different than the 2n local oscillation signals.

24. A method of generating a linear frequency modulation signal comprising the steps of:

generating a synthesized waveform signal having n sequential pairs of upchirp/downchirp components, each of the n sequential pairs having an upchirp component for a first half of a signal duration of a pair followed by a downchirp component for a second half of the signal duration; and respectively mixing the upchirp components and the downchirp components of the n sequential pairs of the synthesized waveform with one of 2n local oscillation signals each having a different respective frequency to provide a linear frequency modulated signal having a bandwidth 2n times greater than a bandwidth of the synthesized waveform signal.

25. The method of generating a linear frequency modulation signal of claim 24, wherein said step of generating further comprises generating the synthesized waveform signal as having an additional upchirp component following the n sequential pairs of upchirp/downchirp components, said step of respectively mixing further comprising mixing the additional upchirp component with an additional local oscillation signal having a frequency different than the 2n local oscillation signals.

* * * * *